United States Patent
Akamatsu et al.

[11] Patent Number: 6,134,681
[45] Date of Patent: Oct. 17, 2000

[54] SEMICONDUCTOR MEMORY DEVICE WITH SPARE MEMORY CELL

[75] Inventors: Hiroshi Akamatsu; Shigeru Mori, both of Hyogo, Japan

[73] Assignee: Mitsubishi Denki Kabushiki Kaisha, Tokyo, Japan

[21] Appl. No.: 09/004,299

[22] Filed: Jan. 8, 1998

[30] Foreign Application Priority Data

Jun. 19, 1997 [JP] Japan ..................................... 9-162316

[51] Int. Cl.<sup>7</sup> .................................................. G11C 29/00
[52] U.S. Cl. ...................... 714/710; 365/200; 365/230.06
[58] Field of Search .................................... 714/7, 54, 710, 714/711; 365/200, 201

[56] References Cited

U.S. PATENT DOCUMENTS

| | | | |
|---|---|---|---|
| 3,654,610 | 4/1972 | Sander et al. | 714/711 |
| 4,656,610 | 4/1987 | Yoshida | 365/200 |
| 5,299,161 | 5/1994 | Choi et al. | 365/201 |
| 5,422,850 | 6/1995 | Sukegawa et al. | 365/200 |
| 5,428,573 | 6/1995 | Watanabe | 365/200 |
| 5,566,128 | 10/1996 | Magome | 365/230.06 |
| 5,677,881 | 10/1997 | Seo et al. | 365/200 |
| 5,703,817 | 12/1997 | Shiratake et al. | 365/200 |

FOREIGN PATENT DOCUMENTS

| | | | |
|---|---|---|---|
| 6-76564 | 3/1994 | Japan | G11C 11/401 |
| 8-221978 | 8/1996 | Japan | G11C 11/407 |

OTHER PUBLICATIONS

A 14–ns 4–MB CMOS DRAM with 300–mW Active Power, Kirihata, et al., IEEE, Sep. 1992.

High Speed Sub–halfmicron Flash Memory Technology with Simple Stacked Gate Structure Cell, Mori, et al., IEEE, Apr. 1994.

A New Buried–Channel EEPROM Device, Hu, et al., IEEE, Nov. 1992.

High–Tc Superconductor–Semiconductor Wideband Amplifiers, Ghoshal, et al., IEEE, Jul. 1994.

*Primary Examiner*—Albert De Cady
*Assistant Examiner*—Guy Lamarre
*Attorney, Agent, or Firm*—McDermott, Will & Emery

[57] ABSTRACT

In an SDRAM, when a spare column selection line is not used, access to a column selection line is started at a first time at which complementary column address signals are defined, and access to the column selection line is stopped until a second time at which the level of a redundant column decoder activation signal is defined when the spare column selection line is used. Compared with the case in which access to the column selection line is always stopped until the second time, the access speed is increased.

4 Claims, 10 Drawing Sheets

PRIOR ART

PRIOR ART

FIG. 14A CLK

PRIOR ART

FIG.17A /CAD0~CAD7

FIG.17B /SCE

FIG.17C CDE

FIG.17D CSL (SCSL)

← CSL IS SELECTED
← SCSL IS SELECTED

TIME t →
t1 t2

SEMICONDUCTOR MEMORY DEVICE WITH SPARE MEMORY CELL

BACKGROUND OF THE INVENTION

1. Field of the Invention

The present invention relates to a semiconductor memory device, and more particularly relates to a semiconductor memory device having a spare memory cell for replacement of a defective memory cell in which data is electrically rewritable.

2. Description of the Background Art

Figure 8:
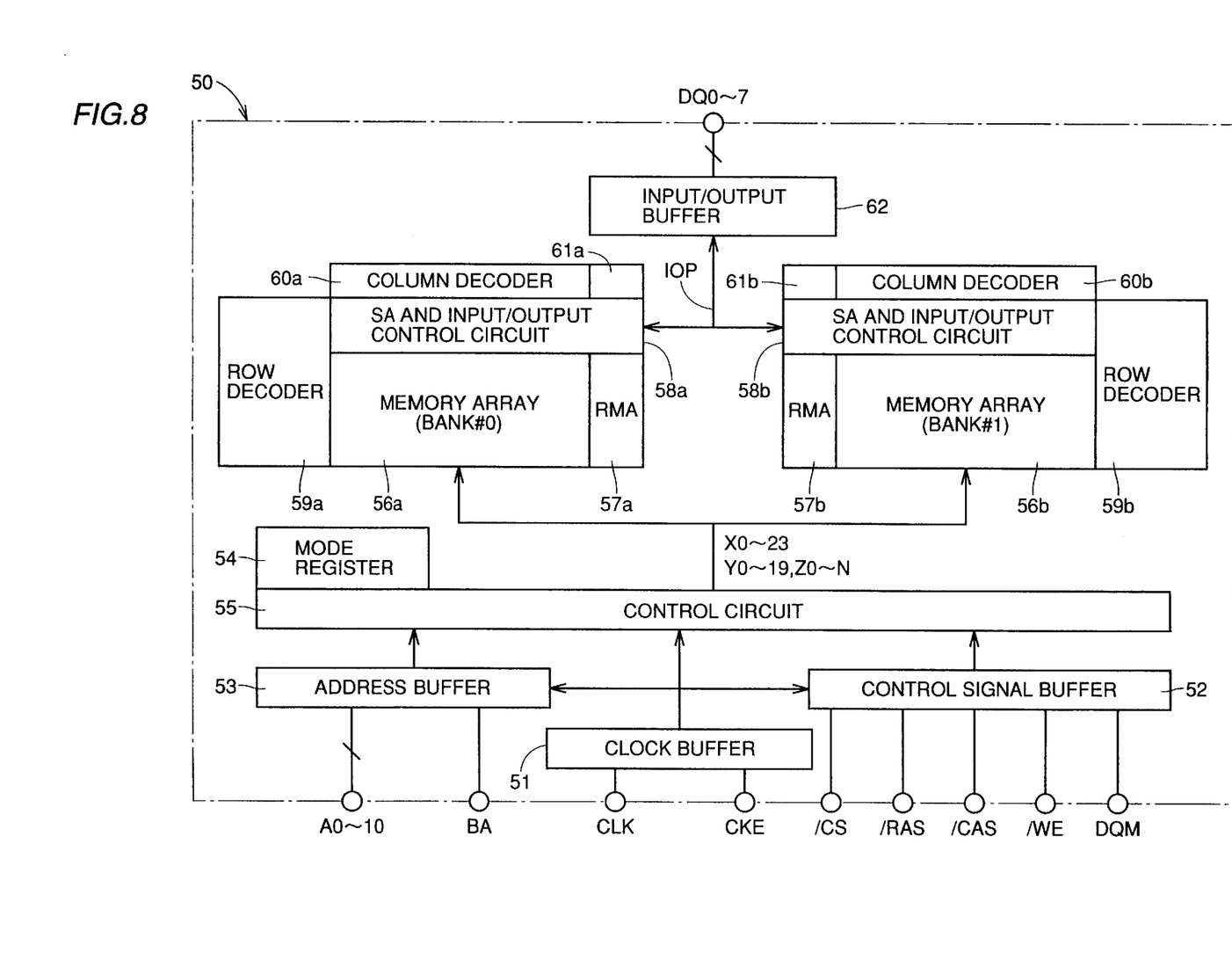
FIG. 8 is a block diagram showing a structure of a conventional SDRAM.
Figure 9:
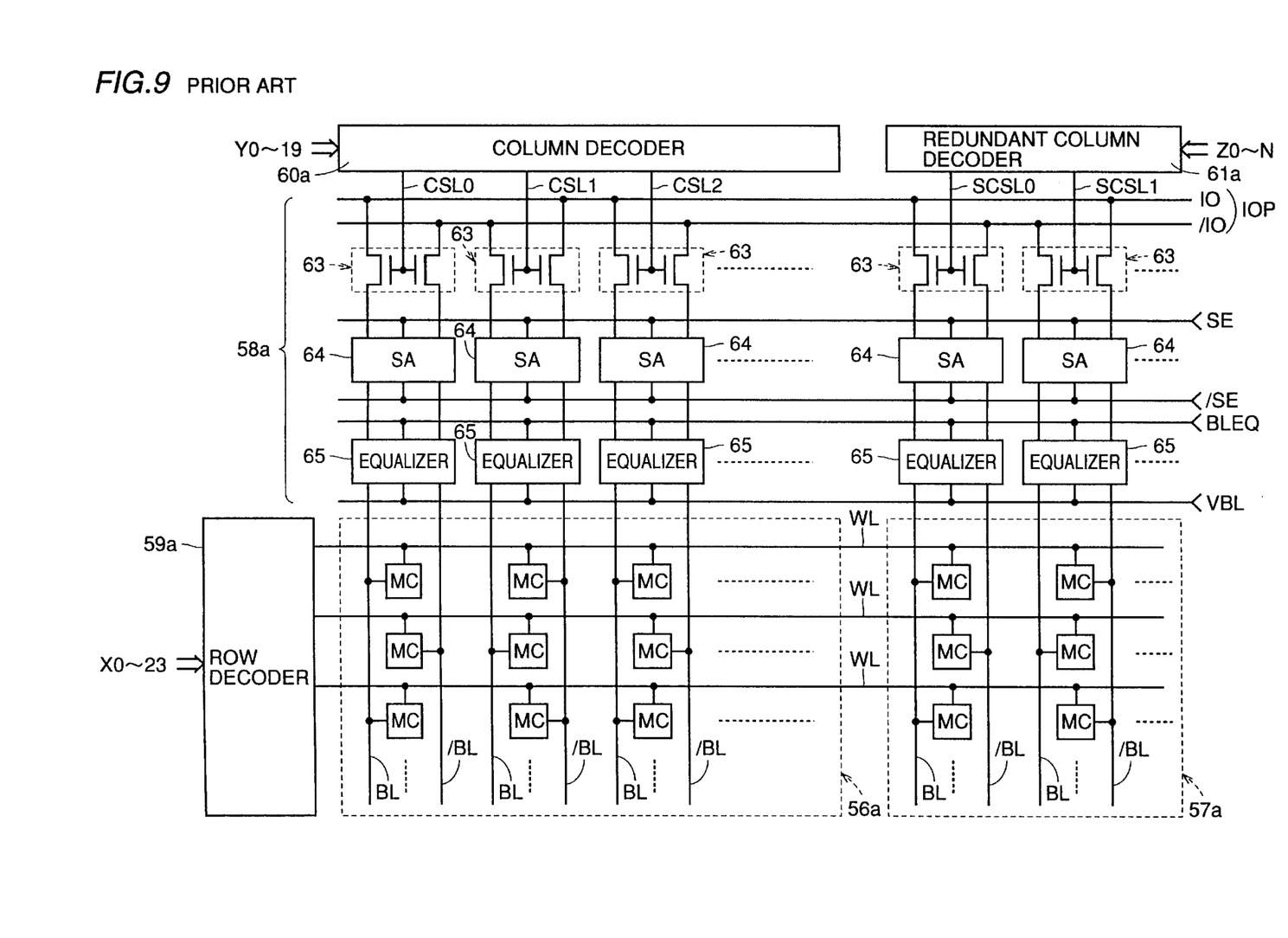
FIG. 9 is a circuit block diagram showing a structure of a main portion of the SDRAM in FIG. 8 with a partially omitted portion.

FIG. 8 is a block diagram showing a structure of a conventional synchronous dynamic random access memory (hereinafter referred to as SDRAM), and FIG. 9 is a circuit block diagram showing a structure of its main portion. Referring to FIGS. 8 and 9, the SDRAM includes a clock buffer 51, a control signal buffer 52, an address buffer 53, a mode register 54, and a control circuit 55.

Clock buffer 51 is activated by signal CKE and transmits external clock signal CLK to control signal buffer 52, address buffer 53 and control circuit 55. Control signal buffer 52 transmits external control signals /CS, /RAS, /CAS, /WE and DQM to control circuit 55 synchronously with external clock signal CLK from clock buffer 51. Address buffer 53 transmits external address signals A0–A10 as well as bank selection signal BA to control circuit 55 synchronously with external clock signal CLK from clock buffer 51. Mode register 54 stores a mode designated by external address signals A0–A10 or the like. Control circuit 55 generates various internal signals according to signals supplied from buffers 51–53 and mode register 54, and controls the entire SDRAM.

The SDRAM further includes a memory array 56a (bank #0), a memory array 56b (bank #1), redundant memory arrays (RMA) 57a and 57b, sense refresh amplifier and input/output control circuits 58a and 58b, row decoders 59a and 59b, column decoders 60a and 60b, redundant column decoders 61a and 61b, and an input/output buffer 62.

As shown in FIG. 9, memory array 56a includes a plurality of memory cells MC arranged in rows and columns, a word line WL provided corresponding to each row, and a bit line pair BL and /BL provided corresponding to each column. Memory array 56a includes, for example, 1024 word lines WL, and 256 bit line pairs BL and /BL.

Memory cell MC is of a well-known type including a transistor for access and a capacitor for storing information. Word line WL transmits an output from row decoder 59a and activates memory cell MC in a selected row. A data signal is input from bit line pair BL and /BL to a selected memory cell MC or output from a selected memory cell MC to bit line pair BL and /BL.

Redundant memory array 57a has the same structure as memory array 56a except that redundant memory array 57a has a smaller number of columns than memory array 56a. Memory array 56a and redundant memory array 57a have the same number of rows, and word line WL is shared between memory array 56a and redundant memory array 57a. Now suppose that redundant memory array 57a has N+1 (N is an integer of 0 or more) columns. If there exists a defective column in memory array 56a, the column is replaced with a column in redundant memory array 57a.

Sense refresh amplifier and input/output control circuit 58a includes: a data signal input/output line pair IO and /IO (IOP); a column selection line CSL provided corresponding to each column in memory array 56a; a spare column selection line SCSL provided corresponding to each column in redundant memory array 57a; a column selection gate 63; a sense refresh amplifier 64; and an equalizer 65 provided corresponding to each column respectively. Column selection gate 63 includes a pair of N channel MOS transistors connected between bit line pair BL and /BL and data signal input/output line pair IO and /IO of a corresponding column. The gate of each N channel MOS transistor is connected to column decoder 60a or redundant column decoder 61a via column selection line CSL or spare column selection line SCSL of a corresponding column. When column selection line CSL or spare column selection line SCSL is caused to become H level of a selected level by column decoder 60a or redundant column decoder 61a, N channel MOS transistor is turned on, and bit line pair BL and /BL and data signal input/output line pair IO and /IO are coupled.

When sense amplifier activation signals SE and /SE respectively become H level and L level, sense refresh amplifier 64 amplifies a slight potential difference between bit line pair BL and BL to supply voltage Vcc. When bit line equalize signal BLEQ attains H level of an activation level, equalizer 65 equalizes the potential on bit lines BL and /BL to bit line potential VBL.

Row decoder 59a causes one of the 1024 word lines WL to become H level of the selected level according to predecode signals X0–X23 from control circuit 55. Column decoder 60a causes one of the 256 column selection lines CSL to become H level of the selected level according to predecode signals Y0–Y19 from control circuit 55. Redundant column decoder 61a causes one of the N+1 spare column selection lines SCSL to attain H level of the selected level according to predecode signals Z0–ZN from control circuit 55.

Memory arrays 56a and 56b, redundant memory arrays 57a and 57b, sense refresh amplifier and input/output control circuits 58a and 58b, row decoders 59a and 59b, column decoders 60a and 60b, and redundant column decoders 61a and 61b have the same structure respectively.

One end of data signal input/output line pair IOP is, as shown in FIG. 8, connected to input/output buffer 62. In the write mode, input/output buffer 62 applies externally supplied data to a selected memory cell MC via data signal input/output line pair IOP. In the read mode, input/output buffer 62 outputs data read from a selected memory cell MC to the outside.

Next an operation of the SDRAM shown in FIGS. 8 and 9 is briefly described. In the write mode, a column decoder (in this case 60a or 61a) corresponding to a selected bank (e.g. #0) sets column selection line CSL or SCSL according to predecode signals Y0–Y19 or Z0–ZN to H level of the activation level, and causes column selection gate 63 to be conductive.

Input/output buffer 62 applies externally supplied write data to bit line pair BL and /BL in a selected column via data signal input/output line pair IO and /IO. Write data is supplied as the potential difference between bit line pair BL and /BL. Next row decoder 59a sets a word line WL in a row according to predecode signals X0–X23 to H level of the selected level, and activates memory cell MC in the row. The capacitor of the selected memory cell MC stores electric charge with its amount corresponding to the potential of bit line BL or /BL.

In the read mode, bit line equalize signal BLEQ falls to L level of an inactivation level, equalizer 65 is inactivated, and equalization of bit lines BL and /BL is stopped. Row decoder 59a sets word line WL in a row according to predecode signals X0–X23 to H level of the selected level. The potential of bit lines BL and /BL slightly changes according to the amount of potential of the capacitor in the activated memory cell MC.

Next sense amplifier activation signals SE and /SE respectively attain H level and L level and sense refresh amplifier 64 is activated. When the potential of bit line BL is slightly higher than that of bit line /BL, the potential of bit line BL is increased to H level, and the potential of bit line /BL is decreased to L level. On the other hand, when the potential of bit line /BL is slightly higher than that of bit line BL, the potential of bit line /BL is increased to H level and the potential of bit line BL is decreased to L level.

Column decoder 60a or 61a sets column select line CSL or SCSL in a column according to predecode signals Y0–Y19 or Z0–ZN to H level of the selected level, and causes column selection gate 63 in the column to be conducting. Data on bit line pair BL and /BL in the selected column is supplied to input/output buffer 62 via column selection gate 63 and data signal input/output line pair IO and /IO. Input/output buffer 62 outputs read data to the outside.

Next a method of selecting column in the SDRAM is described in detail.

256 column selection lines CSL0–CSL255 in memory array 56a are divided in advance into 8 blocks each including 32 column selection lines CSL, and each block is divided into 8 groups each including 4 column selection lines CSL in advance. Predecode signals Y12–Y19 are respectively allocated to eight blocks, predecode signals, Y4–Y11 are respectively allocated to eight groups and predecode signals Y0–Y3 are respectively allocated to four column selection lines CSL. Accordingly, one of the predecode signals Y12–Y19, signal Yk (k is an integer of 12–19), one of the predecode signals Y4–Y12, signal Yj (j is an integer of 4–12), and one of the predecode signals Y0–Y3, signal Yi (i is an integer of 0–3) designate one of the 256 column selection lines CSL0–CSL255, CSLm (m is an integer of 0–255).

Specifically, first control circuit 55 takes address signals A0–A7 as column address signals CA0–CA7 according to signals supplied from buffers 51 and 52, and converts the signals CA0–CA7 to complementary address signals CAD0–CAD7 and /CAD0–/CAD7.

Figure 10A:
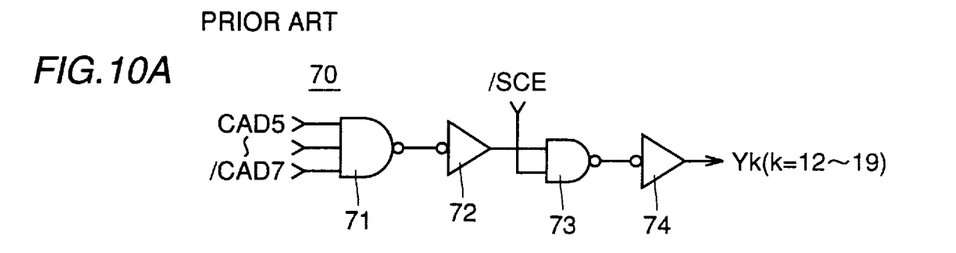
FIGS. 10A–10C are circuit diagrams showing a structures of predecoders included in a control circuit in FIG. 8.
Figure 10B:
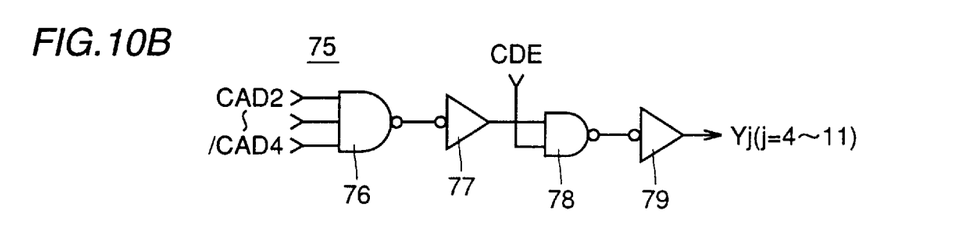
Figure 10C:
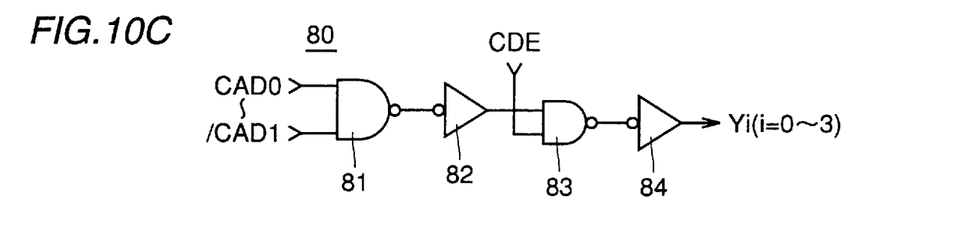

As shown in FIGS. 10A–10C, control circuit 55 is provided with eight predecoders 70, eight predecoders 75, and four predecoders 80. Eight predecoders 70 are respectively provided corresponding to predecode signals Y12–Y19. Eight predecoders 75 are respectively provided corresponding to predecode signals Y4–Y11. 4 predecoders 80 are provided corresponding to predecode signals Y0–Y3 respectively.

Any three of complementary column address signals CAD5–CAD7 and /CAD5–/CAD7 are allocated to each of predecode signals Y12–Y19 in advance. Each predecoder 70 includes NAND gates 71 and 73 and inverters 72 and 74. NAND gate 71 receives three complementary column address signals allocated in advance, and its output is supplied to inverter 72. NAND gate 73 receives an output from inverter 72 and signal ISCE, and its output is supplied to the input of inverter 74. An output from inverter 74 is predecode signal Yk. Predecoder 70 outputs H level when all of the allocated three complementary column address signals and signal /SCE attain H level.

Any three of complementary column address signals CAD2–CAD4 and /CAD2–/CAD4 are allocated to each of predecode signals Y4–Y11 in advance. Each predecoder 75 includes NAND gates 76 and 78 and inverters 77 and 79. NAND gate 76 receives the three complementary column address signals that have been allocated in advance, and its output is supplied to inverter 77. NAND gate 78 receives an output from inverter 77 and signal CDE, and its output is applied to inverter 79. An output from inverter 79 is predecode signal Yj. Predecoder 75 outputs H level when the allocated three complementary column address signals and signal CDE all attain H level.

Any two of complementary column address signals CAD0, CAD1, /CAD0 and /CAD1 are allocated to each of predecode signals Y0–Y3 in advance. Each predecoder 80 includes NAND gates 81 and 83 and inverters 82 and 84. NAND gate 81 receives the two complementary column address signals which have been allocated in advance, and its output is input to inverter 82. NAND gate 83 receives an output from inverter 82 and signal CDE, and its output is input to inverter 84. An output from inverter 84 is predecode signal Yi. Predecoder 80 outputs H level when the two complementary column address signals allocated and signal CDE all attain H level.

Figure 11:
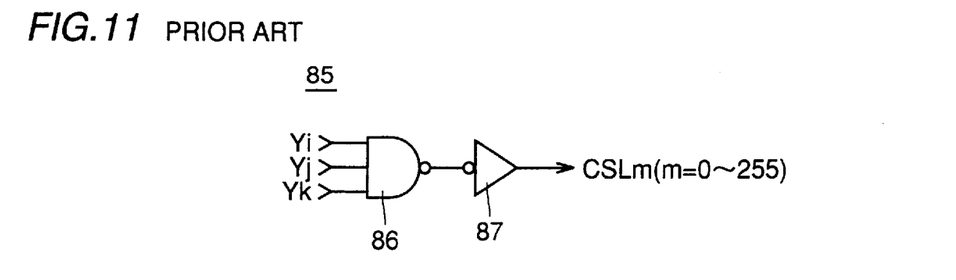
FIG. 11 is a circuit diagram showing a structure of a column decoder unit circuit included in a column decoder in FIG. 8.

As shown in FIG. 11, column decoder 60a includes 256 column decoder unit circuits 85. The 256 column decoder unit circuits 85 are provided corresponding to 256 column selection lines CSL0–CSL255 respectively. To each of column selection lines CSL0–CSL255, any one of predecode signals Y12–Y19, yk, any one of predecode signals Y4–Y11, Yj, and any one of predecode signals Y0–Y3, Yi are allocated in advance.

Column decoder unit circuit 85 includes an NAND gate 86 and an inverter 87. NAND gate 86 receives the three predecode signals Yi, Yj, and Yk which have been allocated in advance, and its output node is connected to a corresponding column selection line CSLm via inverter 87. Column decoder unit circuit 85 sets the corresponding column selection line CSLm to H level of the selected level when the three predecode signals Yi, Yj and Yk which have been allocated all attain H level.

If there is a defective column in memory array 56a, the address of the defective column is stored in control circuit 55. When the address is supplied to control circuit 55, control circuit 55 outputs predecode signal Zn (n is an integer of 0–N) instead of predecode signals Yi, Yj and Yk, and selects spare column selection line SCSLn instead of defective column selection line CSL.

Figure 12:
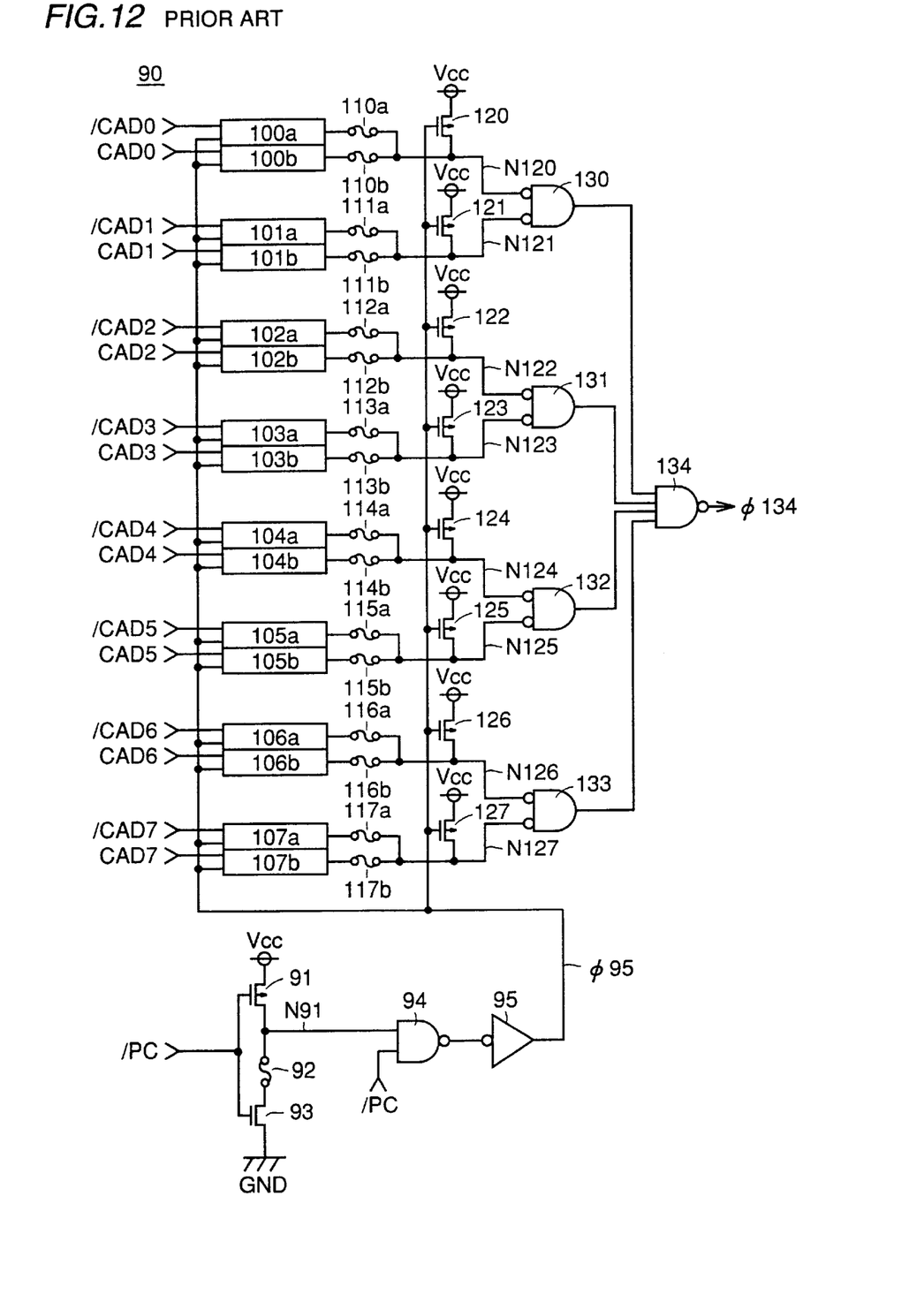
FIG. 12 is a circuit block diagram partially showing a program circuit included in the control circuit in FIG. 8.
Figure 13:
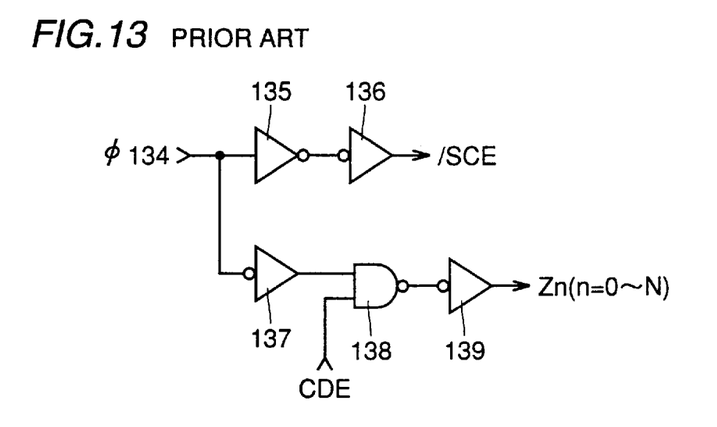
FIG. 13 is a circuit diagram showing a structure of the other portion of the program circuit included in the control circuit in FIG. 8.
Figure 14A:
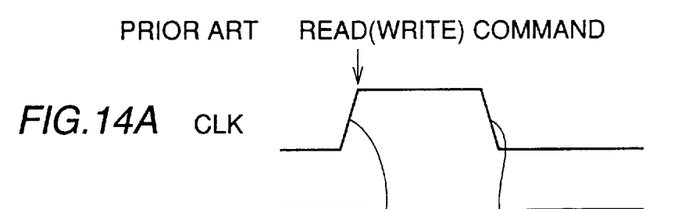
FIGS. 14A and 14B are timing charts provided for describing precharge signal /PC in FIG. 12.
Figure 14B:
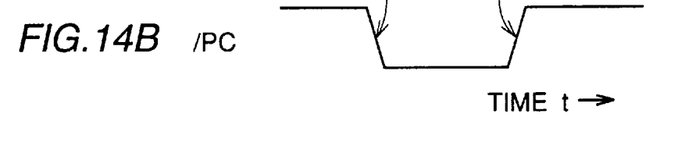

Referring to FIGS. 12 and 13, N+1 program circuits 90 are provided in control circuit 55. N+1 program circuits 90 are provided corresponding to predecode signals Z0–ZN, respectively.

Each program circuit 90 includes fuses 92, 110a–117a and 110b–117b, P channel MOS transistors 91 and 120–127, an N channel MOS transistor 93, NAND gates 94, 134 and 138, inverters 95, 135–137 and 139, switching inverters 100a–107a and 100b–107b, and NOR gates 130–133.

P channel MOS transistor 91, fuse 92 and N channel MOS transistor 93 are connected in series between the line of supply potential Vcc and the line of ground potential GND. The gates of P channel MOS transistor 91 and N channel MOS transistor 93 receive precharge signal /PC. Precharge signal /PC falls to L level when read command or write command is supplied at the rising of clock signal CLK, and rises to H level when clock signal CLK next falls. Fuse 92 is blown when a corresponding spare column selection line SCSL is used, and not blown if a corresponding spare column selection line SCSL is not used.

When fuse 92 is blown, the drain (node N91) of P channel MOS transistor is charged to H level via P channel MOS transistor 91 when precharge signal /PC falls to L level. Node N91 is not discharged even if precharge signal /PC attains H level, maintaining H level. If fuse 92 is not blown, P channel MOS transistor 91, fuse 92 and N channel transistor 93 constitute an inverter. Accordingly, node N91 outputs an inverted signal of precharge signal /PC.

NAND gate 94 receives a signal on node N91 and precharge signal /PC, and its output is supplied to switching inverters 100a–107a and 100b–107b and the gates of P channel MOS transistors 120–127 via inverter 95.

If fuse 92 is blown, precharge signal /PC is delayed in NAND gate 94 and inverter 95 to become output signal φ95 from inverter 95. If fuse 92 is not blown, output signal φ95 is always at L level.

Figure 15:
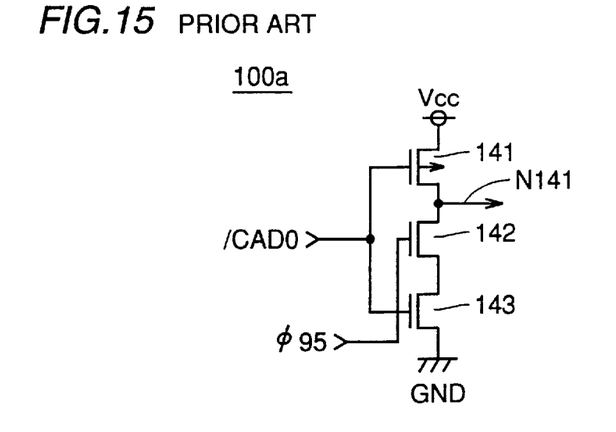
FIG. 15 is a circuit diagram showing a structure of a switching inverter in FIG. 12.

Switching inverters 100a–107a and 100b–107b are provided corresponding to complementary column address signals /CAD0–/CAD7 and CAD0–CAD7, respectively. As shown in FIG. 15, switching inverter 100a includes a P channel MOS transistor 141 and N channel MOS transistors 142 and 143 connected in series between the line of supply potential Vcc and the line of ground potential GND. The gates of MOS transistors 141 and 143 receive corresponding complementary column address signal /CAD0, and the gate of N channel MOS transistor 142 receives signal φ95. The drain of P channel MOS transistor 141 is an output node N141 of switching inverter 100a.

When signal φ95 is at H level, N channel MOS transistor 142 is turned on and switching inverter 100a is activated. When signal φ95 is at L level, N channel MOS transistor 142 is turned off and switching inverter 100a is inactivated. The operations of other switching inverters 101a–107a and 100b–107b are similar to that of switching inverter 100a.

Fuses 110a–117a and 110b–117b are provided corresponding to complementary column address signals /CAD0–/CAD7 and CAD0–CAD7 respectively. Fuses 110a–117a are connected between output nodes N141 of corresponding switching inverters 100a–107a and nodes N120–N127. Fuses 110b–117b are connected between output nodes N141 of corresponding switching inverters 100b–107b and nodes N120–N127.

A fuse corresponding to a complementary column address signal designating a defective column selection line CSL is not blown, and other fuses are blown and the address of the defective column selection line CSL is stored. When the address is input, the outputs from switching inverters 100a–107a and 100b–107b are transmitted to nodes N120–N127 via fuses 110a–117a and 110b–117b.

P channel MOS transistors 120–127 are connected between the line of supply potential Vcc and nodes N120–N127 respectively, and their gates receive signal φ95. When signal φ95 falls to L level, P channel MOS transistors 120–127 are turned on, and nodes N120–N127 are precharged to H level.

NOR gate 130 receives signals that are present on nodes N120 and N121. NOR gate 131 receives signals present on nodes N122 and N123. NOR gate 132 receives signals present on nodes N124 and N125. NOR gate 133 receives signals on nodes N126 and N127. NAND gate 134 receives outputs from NOR gates 130–133.

As shown in FIG. 13, output signal φ134 from NAND gate 134 is amplified by inverters 135 and 136 to become signal /SCE, and supplied to inverter 137. NAND gate 138 receives an output from inverter 137 and signal CDE. An output from NAND gate 138 is inverted by inverter 139 to become predecode signal Zn.

Accordingly, program circuit 90 sets signal /SCE to L level when a complementary column address signal which is programmed by fuses 92, 110a–117a and 110b–117b is supplied. When signal CDE attains H level, program circuit 90 sets corresponding predecode signal Zn to H level.

Figure 16:
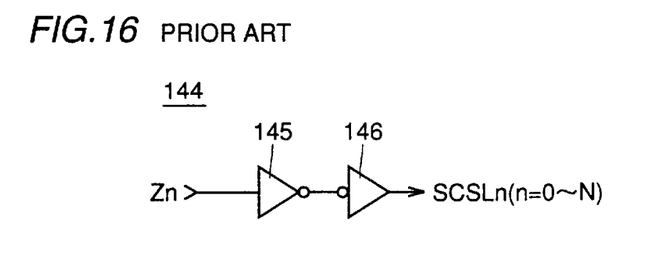
FIG. 16 is a circuit diagram showing a structure of a redundant column decoder unit circuit included in a redundant column decoder in FIG. 8.
Figure 17A:
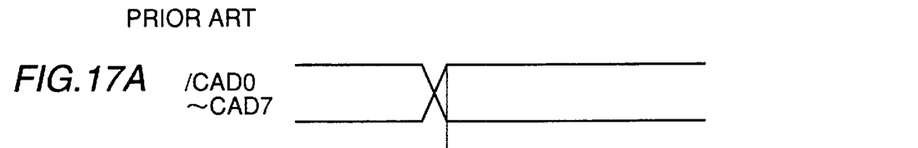
FIGS. 17A–17D are timing charts showing an operation of the SDRAM shown in FIGS. 8–16.
Figures 17B, 17C:
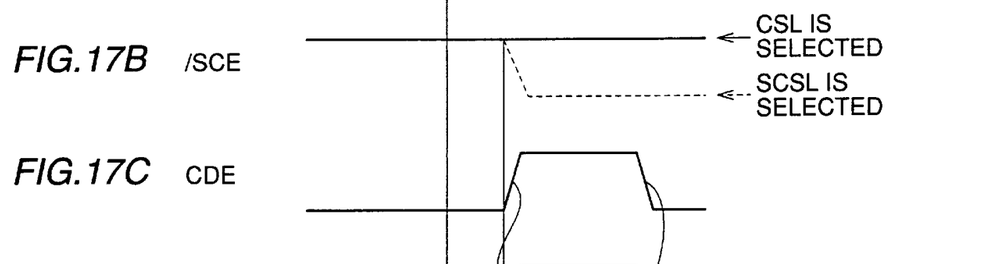
Figure 17D:
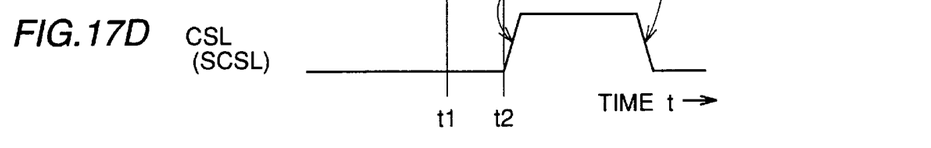

Referring to FIG. 16, redundant column decoder 61a includes N+1 redundant column decoder unit circuits 144. N+1 redundant column decoder unit circuits 144 are provided corresponding to N+1 spare column selection lines SCSL0–SCSLN respectively. Predecode signals Z0–ZN are allocated to spare column selection lines SCSL0–SCSLN respectively in advance.

Each redundant column decoder unit circuit 144 includes inverters 145 and 146 connected in series. When the allocated predecode signal Zn rises to H level, redundant column decode unit circuit 144 sets corresponding spare column selection line SCSLn to H level of the selected level.

FIGS. 17A–17D are timing charts showing a column selecting operation of the SDRAM. With reference to FIGS. 17A–17D, at time t1, complementary column address signals /CAD0–/CAD7 and CAD0–CAD7 are defined.

If complementary column address signals /CAD0–/CAD7 and CAD0–CAD7 are programmed by program circuit 90, signal /SCE falls to L level and signal CDE rises to H level at time t2 after a prescribed time (delay time of program circuit 90) has passed from time t1. Responsively, an output from predecoder 70 in FIG. 10, that is, predecode signal Yk is fixed at H level, and an output from column decoder unit circuit 85 in FIG. 11, that is, column selection line CSLm is fixed at L level. At the same time, predecode signal Zn shown in FIG. 13 rises to H level, an output from redundant column decoder unit circuit 144 shown in FIG. 16, that is, spare column selection line SCSLn rises to H level.

If complementary column address signals /CAD0–/CAD7 and CAD0–CAD7 are not programmed by program circuit 90, signal /SCE does not change to maintain H level, and signal CDE attains H level at time t2. Responsively, one of predecode signals Y12–Y19 shown in FIG. 10, that is, signal Yk, one of predecode signals Y4–Y11, Yj, one of predecode signals Y0–Y3, Yi attain H level, and an output from one of the 256 column decoder unit circuits 85 shown in FIG. 11, that is, column selection line CSLm rises to H level of the selected level. On the other hand, predecode signal Zn shown in FIG. 13 is fixed at L level, and an output from redundant decoder unit circuit 144 in FIG. 16, that is, spare column selection line SCSLn is fixed at L level of the non-selected level.

The access to column selection lines CSL and SCSL is not carried out until time t2 since if the access to column selection lines CSL and SCSL is started at time t1, a defective column selection line CSLm is selected between times t1 and t2, and a spare column selection line SCSLn is selected after time t2, resulting in the multi-selection.

In the normal DRAM, although predecoding is started after an address transition detecting circuit detects transition of a complementary address signal, the multi-selection does not occur because of a sufficiently long delay time of the address transition detecting circuit.

However, in the conventional SDRAM, the access to column selection line CSL is not carried out until signal /SCE is defined even if there is no defective column and spare column selection line SCSL is not used. As a result, there exists a useless waiting time.

SUMMARY OF THE INVENTION

One object of the present invention is to provide a semiconductor memory device in which a higher access speed can be achieved even if a spare memory cell is not used.

The invention can be briefly described as follows. A first gate circuit is provided between a spare selection line and a first decoder for the spare selection line having its output defined after a first time has passed from input of an address signal, and a second gate circuit is provided between a selection line and a second decoder for the selection line having its output defined after a second time shorter than the first time has passed from input of an address signal. A signal generation circuit outputs an activation signal to cause the first and second gate circuits to be conductive after the first time has passed from input of an address signal when a spare memory cell is used. If a spare memory cell is not used, the signal generation circuit outputs an activation signal to cause the first and second gate circuits to be conductive after the second time has passed from input of an address signal. Compared with the conventional approach in which the first and second gate circuits are rendered conductive after the first time has passed from input of an address signal even if a spare memory cell is used or not, the access speed when a spare memory cell is not used can be increased.

Preferably, the signal generation circuit includes first and second delay circuits for delaying a reference signal which is in synchronization with an address signal by the first time and the second time respectively, a fuse used for programming whether a spare memory cell is used or not, and a gate circuit which allows an output signal from the first or the second delay circuit to pass as an activation signal according to the result of the programming by the fuse. Accordingly, the signal generation circuit can be constituted easily.

More preferably, the signal generation circuit includes a plurality of delay circuits connected in series for delaying a reference signal which is in synchronization with an address signal by a first time or a second time to generate an activation signal. Each delay circuit includes: first and second transistors constituting an inverter; a first fuse and a first resistance element connected in parallel with each other for switching charge current of the inverter from/to a higher level to/from a lower level; and a second fuse and a second resistance element connected in parallel with each other for switching discharge current of the inverter from/to a higher level to/from a lower level. The signal generation circuit can thus be constituted easily.

Still preferably, the signal generation circuit includes a plurality of delay circuits connected in series for delaying a reference signal which is in synchronization with an address signal by a first time or a second time to generate an activation signal. Each delay circuit includes: second and fourth transistors constituting an inverter; a first transistor and a first fuse connected in parallel with each other for switching charge current of the inverter from/to a higher level to/from a lower level; and a third transistor and a second fuse connected in parallel with each other for switching discharge current of the inverter from/to a higher level to/from a lower level. Accordingly, the signal generation circuit can be constituted easily.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 1:
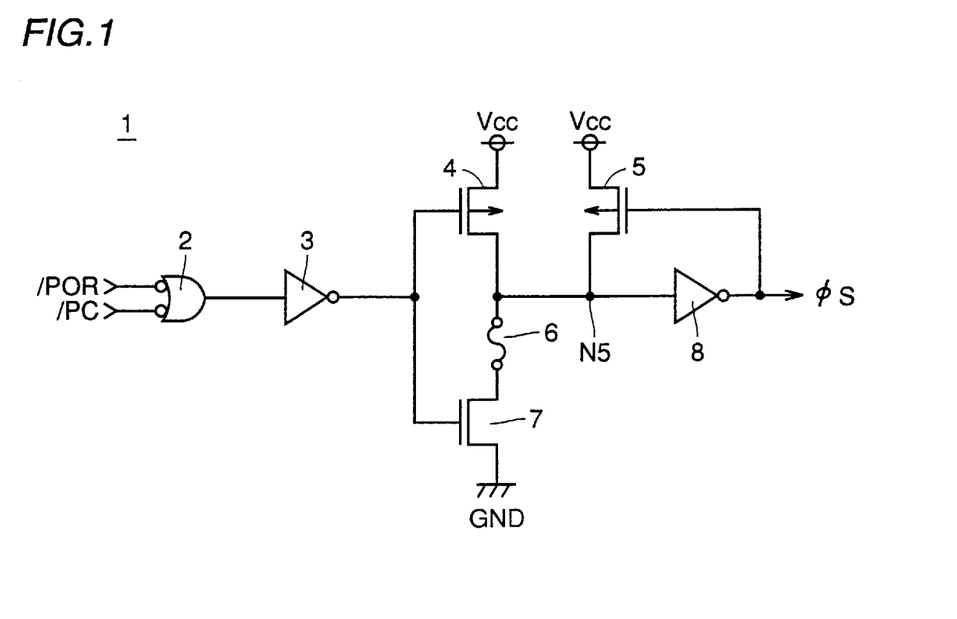
FIG. 1 is a circuit diagram showing a structure of a fuse circuit of an SDRAM according to the first embodiment of the invention.

FIG. 1 is a circuit diagram showing a structure of a fuse circuit 1 included in an SDRAM according to the first embodiment of the invention.

With reference to FIG. 1, fuse circuit 1 includes an NAND gate 2, inverters 3 and 8, P channel MOS transistors 4 and 5, a fuse 6, and an N channel MOS transistor 7. NAND gate 2 receives signal /POR (Power On Reset) and precharge signal /PC. Signal /POR rises to H level after a prescribed time has passed from turning on of the power supply of SDRAM. When signal /POR is at L level, SDRAM is internally reset.

P channel MOS transistor 4, fuse 6 and N channel MOS transistor 7 are connected in series between the line of supply potential Vcc and the line of ground potential GND. An output from NAND gate 2 is supplied to the gates of MOS transistors 4 and 7 via inverter 3. P channel MOS transistor 5 is connected in parallel with P channel MOS transistor 4. The drain (node N5) of P channel MOS transistor 5 is connected to the gate of P channel MOS transistor 5 via inverter 8. P channel MOS transistor 5 and inverter 8 constitute a latch circuit. An output from inverter 8 is output signal US from fuse circuit 1.

If there is no defective column in memory array 56a and spare column selection line SCSL is not used, fuse 6 is not blown off. In this case, P channel MOS transistor 4, fuse 6 and N channel MOS transistor 7 constitute an inverter. At the time of access, signals /POR and /PC both attain H level, so that signal φS also attains H level.

If there is a defective column in memory array 56a and spare column selection line SCSL is used, fuse 6 is blown off. In this case, when at least one of signal /POR and precharge signal /PC falls to L level, P channel MOS transistor 4 is turned on, node N5 attains H level, and signal φS is maintained at L level by the latch circuit constituted by P channel MOS transistor 5 and inverter 8.

Figure 2:
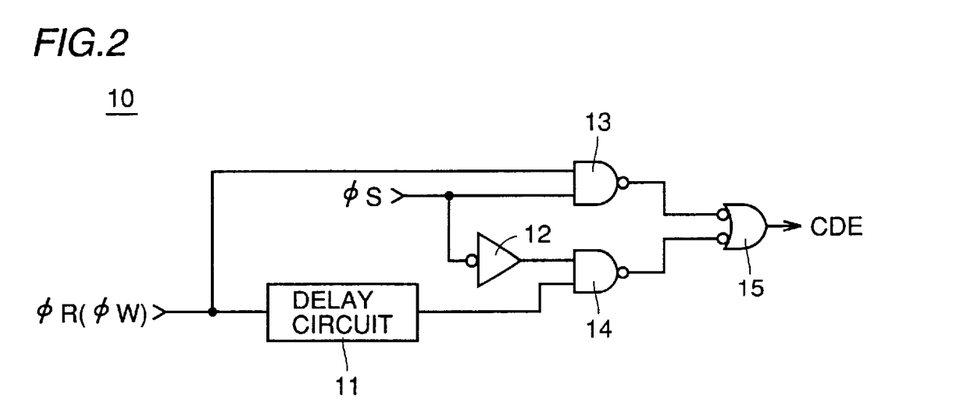
FIG. 2 is a circuit block diagram showing a structure of a signal generation circuit controlled by an output signal from the fuse circuit shown in FIG. 1.
Figure 3A:
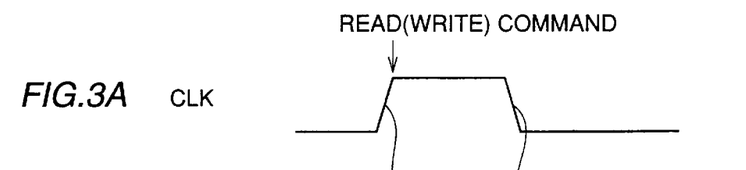
FIGS. 3A–3C are timing charts showing an operation of the signal generation circuit shown in FIG. 2.
Figure 3B:
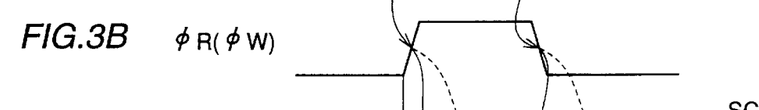
Figure 3C:
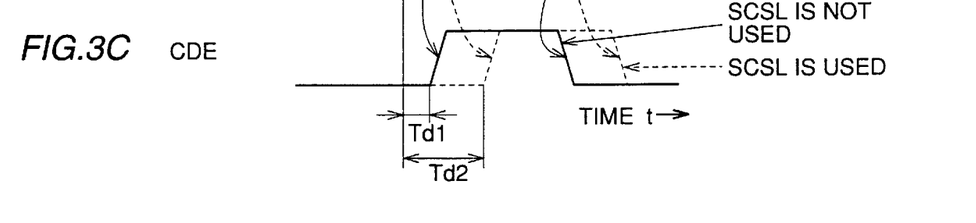
Figure 4A:
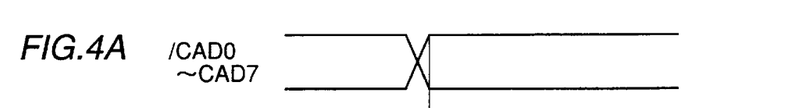
FIGS. 4A–4D are timing charts showing an operation of the SDRM shown in FIGS. 1–3.
Figure 4B:
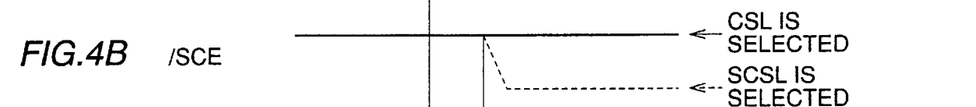
Figures 4C, 4D:
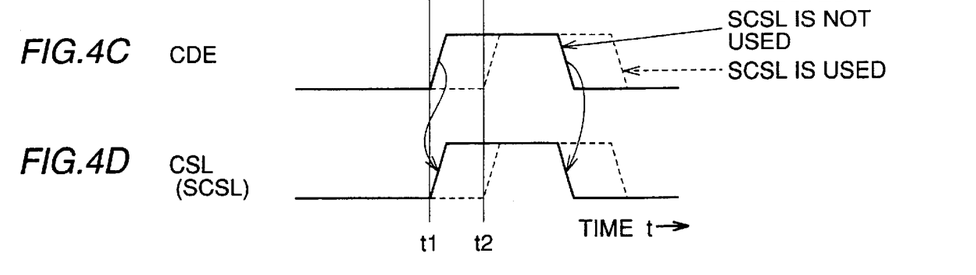

FIG. 2 is a circuit block diagram illustrating a signal generation circuit 10 in the SDRAM. Referring to FIG. 2, signal generation circuit 10 includes a delay circuit 11, an inverter 12 and NAND gates 13–15. Read signal φR (or write signal φW) is directly supplied to one input node of NAND gate 13, and supplied to one input node of NAND gate 14 via delay circuit 11. As shown in FIG. 3, read signal φR (write signal φW) rises to H level when read command (or write command) is supplied at the rising of clock signal CLK, and falls when clock signal CLK next falls. Signal φS is directly supplied to the other input node of NAND gate 13 and supplied to the other input node of NAND gate 14 via inverter 12. NAND gate 15 receives outputs from NAND gates 13 and 14 and generates signal CDE.

If fuse 6 is not blown off and signal φS is at H level at the time of access since there is no defective column in memory array 56a, an output from NAND gate 14 is fixed at H level and NAND gates 13 and 15 operate as an inverter for signal φR (φW). Accordingly, as shown in FIGS. 3A–3C, signal CDE is the one obtained by delaying signal φR (φW) by delay time Td1 of NAND gates 13 and 15.

If fuse 6 is blown off and signal φS is fixed at L level since there is a defective column in memory array 56a, an output from NAND gate 13 is fixed at H level and NAND gates 14 and 15 operate as an inverter for an output from delay circuit 11. Accordingly, signal CDE is the one obtained by delaying signal φR (φW) by delay time Td2 (>Td1) of delay circuit 11 and NAND gates 14 and 15 as shown in FIGS. 3A–3C. Time Td2–Td1 is delay time of delay circuit 11 which is set to be time t2–t1 in FIGS. 17A–17D.

FIGS. 4A–4D are timing charts showing column selecting operation of the SDRAM provided for comparing with FIGS. 17A–17D. With reference to FIGS. 4A–4D, complementary column address signals /CAD0–/CAD7 and CAD0–CAD7 are defined at time t1.

If there is no defective column in memory array 56a, program circuit 90 shown in FIGS. 12 and 13 is not used and fuse 6 in fuse circuit 1 is not blown. In this case, signal /SCE is maintained at H level, and signal CDE rises at time t1. Therefore, the speed of the access to column selection line CSL is increased by t2–t1 compared with the case shown in FIG. 17.

If memory array 56a has any defective column, program circuit 90 in FIGS. 12 and 13 is used, and fuse 6 in fuse circuit 1 is blown. In this case, signal /SCE is defined at the time t2 and signal CDE rises to H level. As a result, the multi-selection for column selection line CSL and spare column selection line SCSL does not occur.

The other structure and operation of the SDRAM above are similar to those of the conventional SDRAM, and description thereof is not repeated.

In this embodiment, if spare column selection line SCSL is not used, access to column selection line CSL is started at the same time that a complementary column address signal is defined. When spare column selection line SCSL is used, access to column selection line SCL or spare column selection line SCSL is started after signal /SCE is defined. Accordingly, when spare column selection line SCSL is not used, the speed of the access to column selection line CSL can be increased. Further, the multi-selection can be prevented when spare column selection line SCL is used.

(Second Embodiment)

Figure 5:
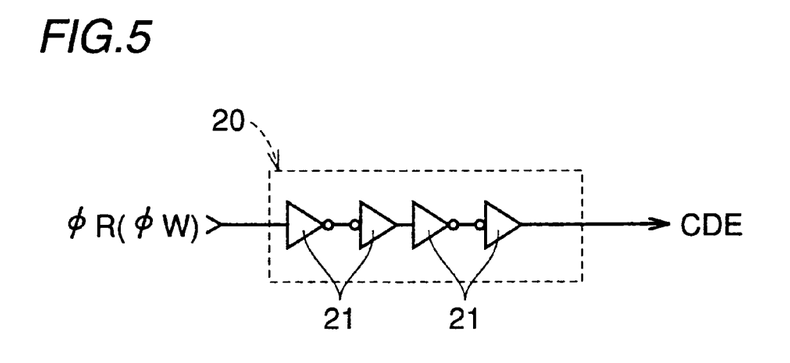
FIG. 5 is a circuit diagram showing a structure of a signal generation circuit of an SDRAM according to the second embodiment of the invention.

FIG. 5 is a circuit diagram illustrating a structure of a signal generation circuit 20 included in an SDRAM according to the second embodiment of the invention. With reference to FIG. 5, signal generation circuit 20 includes an even number (4 in FIG. 5) of delay circuits 21 connected in series, and delays signal φR (φW) to generate signal CDE.

Figure 6:
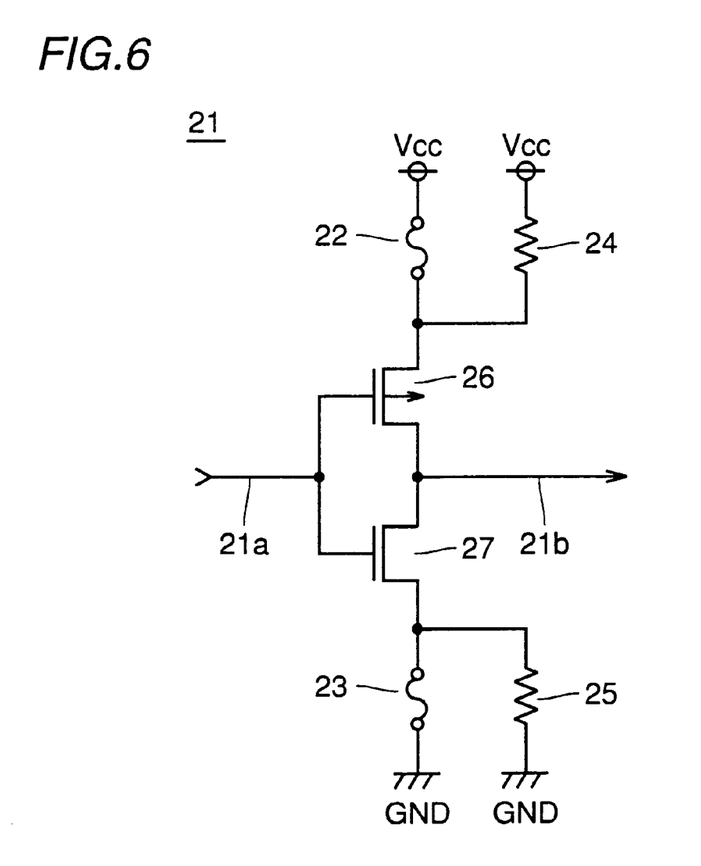
FIG. 6 is a circuit diagram showing a structure of a delay circuit in FIG. 5.

As shown in FIG. 6, delay circuit 21 includes fuses 22 and 23, resistance elements 24 and 25, a P channel MOS transistor 26 and an N channel MOS transistor 27. Fuse 22 and P channel MOS transistor 26 are connected in series between the line of supply potential Vcc and an output node 21b of delay circuit 21. Fuse 23 and N channel MOS transistor 27 are connected in series between the line of ground potential GND and output node 21b. The gates of MOS transistors 26 and 27 are connected to an input node 21a of delay circuit 21. Resistance elements 24 and 25 are respectively connected in parallel with fuses 22 and 23.

Fuses 22 and 23 are not blown when there is no defective column in memory array 56a and spare column selection line SCSL is not used. In this case, when the potential of input node 21a attains H level, N channel MOS transistor 27 is turned on and P channel MOS transistor 26 is turned off, so that output node 21b is discharged to L level via N channel MOS transistor 27, fuse 23 and resistance element 25. When the potential of input node 21a falls to L level, P channel MOS transistor 26 is turned on and N channel MOS transistor 27 is turned off, so that output node 21b is charged to H level via fuse 22, resistance element 24 and P channel MOS transistor 26. As a result, delay time of delay circuit 21 is relatively short. Delay time of signal generation circuit 20 is set to become delay time Td1 shown in FIG. 3.

Fuses 22 and 23 are blown if memory array 56a has a defective column and spare column selection line SCSL is used. In this case, when the potential of input node 21a rises to H level, N channel MOS transistor 27 is turned on and P channel MOS transistor 26 is turned off so that output node 21b is discharged to L level via N channel MOS transistor 27 and resistance element 25. When the potential of input node 21a falls to L level, P channel MOS transistor 26 is turned on and N channel MOS transistor 27 is turned off so that output node 21b is charged to H level via resistance element 24 and P channel MOS transistor 26. As a result, delay time of delay circuit 21 becomes relatively long. Delay time of signal generation circuit 20 is set to become delay time Td2 shown in FIG. 3.

The other structure and operation of the SDRAM are similar to those according to the first embodiment, and description thereof is not repeated.

According to this embodiment, an effect similar to that of the first embodiment can be obtained and further, the structure is simplified.

(Third Embodiment)

Figure 7:
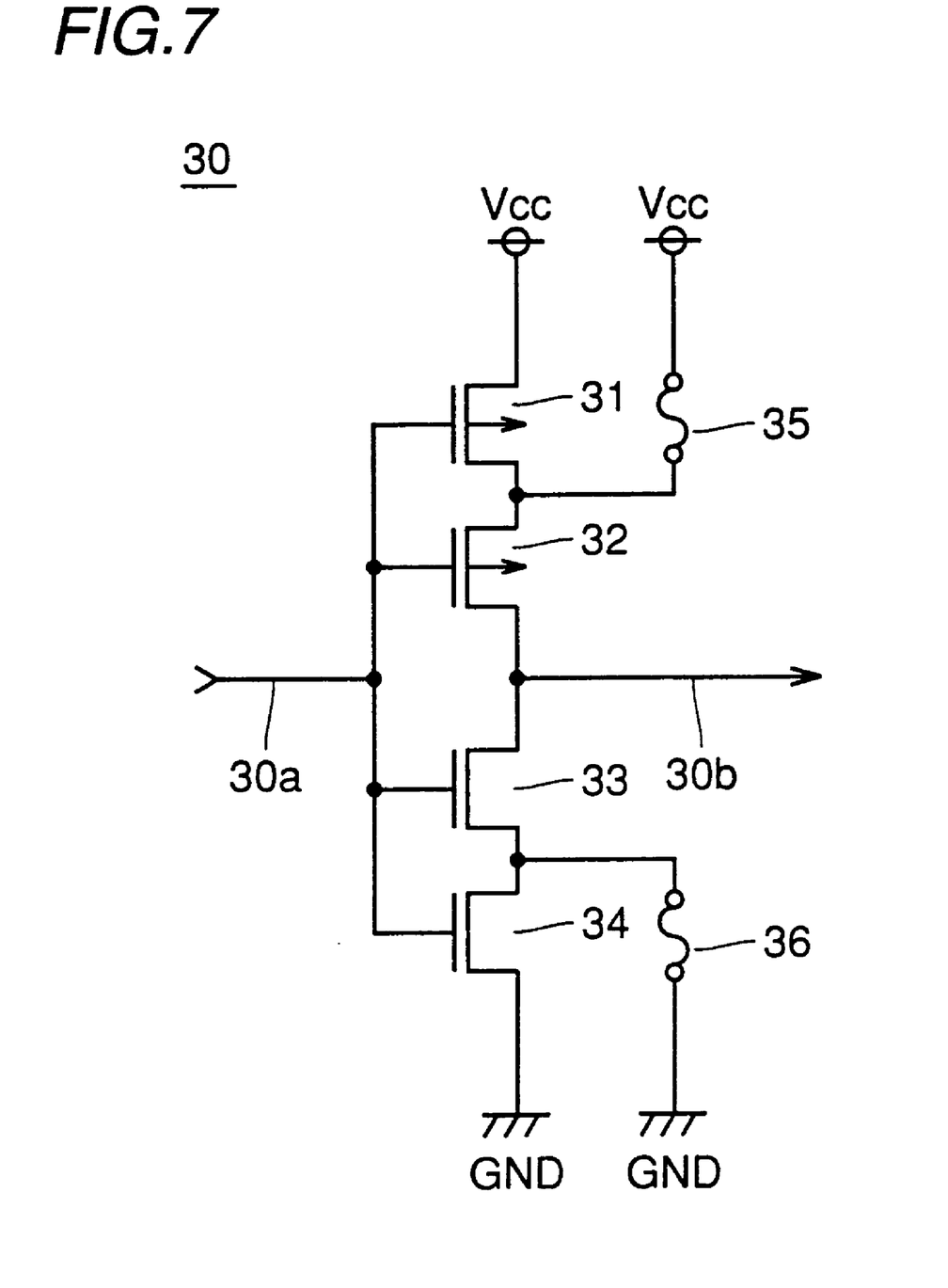
FIG. 7 is a circuit diagram showing a structure of a delay circuit of an SDRAM according to the third embodiment of the invention.

FIG. 7 is a circuit diagram illustrating a structure of a delay circuit 30 included in an SDRAM according to the third embodiment.

With reference to FIG. 7, a difference between the SDRAM and the one according to the second embodiment is that delay circuit 21 in signal generation circuit 20 of FIG. 5 is replaced with delay circuit 30.

Delay circuit 30 includes P channel MOS transistors 31 and 32, N channel MOS transistors 33 and 34, and fuses 35 and 36. MOS transistors 31–34 have the same size. P channel MOS transistors 31 and 32 are connected in series between the line of supply potential Vcc and an output node 30*b* of delay circuit 30. N channel MOS transistors 34 and 33 are connected in series between the line of ground potential GND and output node 30*b* of delay circuit 30. The gates of MOS transistors 31–34 are connected to an input node 30*a* of delay circuit 30. Fuses 35 and 36 are respectively connected in parallel with MOS transistors 31 and 34.

If memory array 56*a* has no defective column and spare column selection line SCSL is not used, fuses 35 and 36 are not blown off. In this case, when the potential of input node 30*a* attains H level, N channel MOS transistors 33 and 34 are turned on and P channel MOS transistors 31 and 32 are turned off, so that output node 30*b* is discharged to L level via N channel MOS transistors 33 and 34 and fuse 36. When the potential of input node 30*a* falls to L level, P channel MOS transistors 31 and 32 are turned on and N channel MOS transistors 33 and 34 are turned off, so that output node 30*b* is charged to H level via P channel MOS transistors 31 and 32 and fuse 35. As a result, delay time of delay circuit 30 becomes relatively long. Delay time of signal generation circuit 20 is set to become delay time Td1 shown in FIG. 3.

If memory array 56*a* has any defective column and spare column selection line SCSL is used, fuses 35 and 36 are blown off. In this case, when the potential of input node 30*a* rises to H level, N channel MOS transistors 33 and 34 are turned on and P channel MOS transistors 31 and 32 are turned off, so that output node 30*b* is discharged to L level via N channel MOS transistors 33 and 34. When the potential of input node 30*a* falls to L level, P channel MOS transistors 31 and 32 are turned on and N channel MOS transistors 33 and 34 are turned off, so that output node 30*b* is charged to H level via P channel MOS transistors 31 and 32. Accordingly, delay time of delay circuit 30 becomes relatively long. Delay time of signal generation circuit 20 is set to become delay time Td1 shown in FIG. 3.

According to this embodiment, an effect similar to that of the second embodiment can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device in which data is electrically rewritable, comprising:

a plurality of memory cells to which addresses signals specific thereto are allocated respectively;

a selection line provided corresponding to each memory cell for selecting a corresponding memory cell;

a spare memory cell for replacing a defective one of said plurality of memory cells;

a spare selection line for selecting said spare memory cell;

a first decoder which outputs, in response to input of an address signal designating said defective memory cell, a first activation signal after a first time has passed from the time of the input;

a second decoder which is associated with each selection line, and starts, in response to input of an address signal designating a memory cell associated with the selection line, output of a second activation signal after a second time shorter than said first time has passed from the time of the input and stops, in response to the output of said first activation signal from said first decoder, the output of said second activation signal;

a signal generation circuit outputting a third activation signal after said first time has passed from the time of the input of said address signal if said defective memory cell is present and outputting said third activation signal after said second time has passed from the time of the input of said address signal if said defective memory cell is absent;

a first selection circuit responding to the output of said first activation signal from said first decoder and the output of said third activation signal from said signal generation circuit to set said spare selection line at selection level and select said spare memory cell;

a second selection circuit associated with each second decoder and responding to the output of said second activation signal from the associated second decoder and the output of said third activation signal from said signal generation circuit to set an associated selection line at selection level and select an associated memory cell; and a write/read circuit writing/reading data into/from said spare memory cell selected by said first selection circuit and the memory cell selected by said second selection circuit.

2. The semiconductor memory device according to claim 1, wherein said signal generation circuit includes:

a first delay circuit for delaying a reference signal which is in synchronization with said address signal by said first time to output the reference signal;

a second delay circuit for delaying said reference signal by said second time to output the reference signal;

a fuse used for programming whether or not said defective memory cell is present;

a gate circuit which passes an output signal from said first delay circuit as said third activation signal if said fuse programs presence of said defective memory cell and passes an output signal from said second delay circuit as said third activation signal if said fuse programs absence of said defective memory cell.

3. The semiconductor memory device according to claim 1, wherein said signal generation circuit includes a plurality of delay circuits connected in series for delaying a reference signal which is in synchronization with said address signal by said first or second time to generate said third activation signal, and each delay circuit includes:

a first transistor of a first conductivity type having its input electrode connected to an input node and having its first electrode connected to an output node;

a second transistor of a second conductivity type having its input electrode connected to said input node and having its first electrode connected to said output node;

a first fuse connected between a line of supply potential and a second electrode of said first transistor, blown off if said defective memory cell is present;

a second fuse connected between a line of ground potential and a second electrode of said second transistor, blown off if said defective memory cell is present; and first and second resistance elements connected in parallel with said first and second fuses respectively.

4. The semiconductor memory device according to claim 1, wherein said signal generation circuit includes a plurality of delay circuits connected in series for delaying a reference signal which is in synchronization with said address signal by said first or second time to generate said activation signal, and each delay circuit includes;

first and second transistors of a first conductivity type connected in series between the line of supply potential and an output node, each having its input electrode connected to an input node;

third and fourth transistors of a second conductivity type connected in series between the line of ground potential and said output node, each having its input electrode connected to said input node; and first and second fuses connected in parallel with said first and fourth transistors respectively, blown off if said defective memory cell is present.

* * * * *